United States Patent [19]

Feygenson

[11] Patent Number: 4,818,713
[45] Date of Patent: Apr. 4, 1989

[54] TECHNIQUES USEFUL IN FABRICATING SEMICONDUCTOR DEVICES HAVING SUBMICRON FEATURES

[75] Inventor: Anatoly Feygenson, Exeter Township, Berks County, Pa.

[73] Assignee: American Telephone and Telegraph Company, AT&T Bell Laboratories, Murray Hill, N.J.

[21] Appl. No.: 111,002

[22] Filed: Oct. 20, 1987

[51] Int. Cl.[4] .................. H01L 21/205; H01L 21/76; H01L 21/265

[52] U.S. Cl. ........................................ 437/31; 437/33; 437/90; 148/DIG. 10; 148/DIG. 117; 357/34

[58] Field of Search ........................ 437/31, 33, 32, 89, 437/162, 90, 72, 62; 148/DIG. 10, DIG. 117, DIG. 124; 357/59 H, 34, 35; 156/643

[56] References Cited

U.S. PATENT DOCUMENTS

| | | | |
|---|---|---|---|
| 3,833,429 | 9/1974 | Monma et al. | 437/147 |
| 4,236,294 | 12/1980 | Anantha et al. | 437/33 |
| 4,309,812 | 1/1982 | Horng et al. | 437/90 |
| 4,338,138 | 7/1982 | Cavaliere et al. | 437/31 |
| 4,592,792 | 6/1986 | Corboy, Jr. et al. | 437/90 |
| 4,640,721 | 2/1987 | Uehara et al. | 437/31 |
| 4,641,416 | 2/1987 | Iranmanesh et al. | 437/36 |
| 4,678,537 | 7/1987 | Ohuchi | 437/31 |
| 4,698,316 | 10/1987 | Corboy, Jr. et al. | 437/90 |
| 4,728,624 | 3/1988 | Silvestri et al. | 437/90 |
| 4,729,965 | 3/1988 | Tamaki et al. | 437/31 |
| 4,749,441 | 6/1988 | Christenson et al. | 437/90 |
| 4,758,530 | 7/1988 | Schubert | 437/90 |
| 4,758,531 | 7/1988 | Beyer et al. | 437/90 |
| 4,760,036 | 7/1988 | Schubert | 437/90 |

OTHER PUBLICATIONS

Ghandhi, *VLSI Fabrication Principles*, John Wiley and Sons, 1983, pp. 373, 421–423, 434–435.
Prospects of SST Technology for High Speed LSI, T. Sakai et al., IEDM, '85, pp. 18–21.

*Primary Examiner*—Brian E. Hearn
*Assistant Examiner*—M. Wilczewski
*Attorney, Agent, or Firm*—Wendy W. Koba

[57] ABSTRACT

Submicron resolution in the fabrication of transistors is obtained by using sidewall techniques. The techniques described remove the sidewalls after oxidizing the materials between the sidewalls and the openings so formed by the removal are used as a mask for subsequent substrate modification by either diffusion or ion implantation.

7 Claims, 3 Drawing Sheets

TECHNIQUES USEFUL IN FABRICATING SEMICONDUCTOR DEVICES HAVING SUBMICRON FEATURES

TECHNICAL FIELD

This invention relates to the field of semiconductor fabrication techniques and the semiconductor devices made by such techniques.

BACKGROUND OF THE INVENTION

Although the integrated circuit market is dominated by field effect transistors, bipolar transistors are still of considerable interest because, for example, their operating speeds are typically higher than are the operating speeds of field effect transistors. As device dimensions decrease, due to a desire for still higher operating speeds as well as greater packing densities, fabrication of bipolar, as well as field effect, transistors becomes more difficult. For example, a high speed bipolar transistor requires fabrication of a small base region which must not only be electrically contacted but must also be accurately aligned with respect to both the emitter and collector regions. A small base region is desirable because it reduces the emitter-base capacitance which is one of the factors limiting device operating speed. Additionally, a small base width improves device response time. It will also be appreciated that electrical contacts to both the emitter and collector regions must also be fabricated which are small and have low resistance. Similar fabrication problems also arise as the dimensions of field effect transistors decrease.

Numerous techniques have been devised for fabricating bipolar transistors. See, for example, U.S. Pat. Nos. 3,833,429 issued on Sept. 3, 1974 and 4,338,138 issued on July 6, 1982 for illustrative techniques. These and other fabrication techniques have been developed to a level of sophistication such that bipolar transistors with submicron feature sizes have been fabricated. For example, an illustrative bipolar transistor with submicron features is described in International Electron Devices Meeting, 1985, paper 2.1, pp. 18-21. The technique described by the authors is termed "The Supper Self-Aligned Process Technology, i.e., SST. The fabrication technique is relatively complicated although only a single patterning step using an optical mask is said to be required. Many materials, e.g., silicon dioxide, silicon nitride and polysilicon, are used, but the typical sequence for each material used comprises depositing the material and then selectively etching it to form the desired pattern with perhaps an intermediate oxidation step. The fabrication sequence is depicted in his FIG. 2 and the device in his FIG. 1.

Although useful SST devices were apparently fabricated, there are some undesirable limitations to the described technique which also impose limitations on the characteristics of the device disclosed. For example, while the disclosed technique can probably produce feature sizes as small as 0.20 μm, the scaled down dimension of the emitter region, variations in the etch rate may prohibit a further reduction of the feature sizes by as much as an order of magnitude. Additionally, the distance between the base and emitter metal contacts is determined by optical photolithographic and etching technique limitations. The resulting relatively large spacing shown in FIG. 1 is undesirable because the sheet resistance of the polysilicon used for the base contact is an important factor in determining the extrinsic base resistance. The extrinsic base resistance for the disclosed device will be relatively high thus resulting in increased noise, i.e., it acts as a noise source connected to the base.

It will also be appreciated by those skilled in the art that control of the polysilicon sheet resistance will be relatively difficult because the polysilicon grain size is a function of the deposition parameters, annealing conditions, etc., and these parameters may be difficult to control precisely in practice. Variations in both the carrier mobility in the polysilicon film and the extrinsic base resistance may result in variations in device operating characteristics.

Another limitation arises because doped polysilicon is used as the diffusion source to form the junction between the base and emitter. Process control problems will almost certainly result because the emitter profile is determined by the surface conditions at the single crystal/polycrystalline interface. It is known to those skilled in the art that several layers of an oxide at this interface may dramatically change the emitter profile due to surface segregation effects.

It is apparent that many of the limitations described with respect to device performance might be avoided with a fabrication technique that permits fabrication of features with dimensions smaller than the minimum feature size permitted by direct patterning.

SUMMARY OF THE INVENTION

A semiconductor device is fabricated by a method that patterns a layer of material on a semiconductor substrate to form openings exposing portions of the substrate; forms sidewall spacers in the opening which leave portions of the substrate exposed; grows a material in said portions; removes said sidewall spacers to expose portions of said substrate; and modifies the portions of said substrate thus exposed. The size of the sidewall spacers determines the size of the minimum feature dimension. As the spacers can be small, the minimum feature size can also be small.

In a preferred embodiment, submicron resolution is obtained by patterning a layer comprising a dielectric on a silicon substrate to form openings which expose surfaces of the silicon substrate, depositing a nitride layer in said openings, patterning the nitride layer to form sidewall spacers which expose portions of the silicon surface, depositing silicon on said exposed portions, and oxidizing the deposited silicon. Removal of the nitride spacers then exposes portions of the silicon surface with the openings so formed being accurately spaced from each other and having dimensions carefully controlled by the size of the sidewalls. After removal of the spacers has been completed, further steps, such as diffusion or ion implantation may be performed, to modify the exposed silicon surface. For example, the emitter and base regions may be formed by implantation. This technique, which is expediently used to fabricate bipolar transistors, described differs from prior art sidewall spacer techniques for reducing dimensions below those attainable by conventional optical lithography because the sidewall spacers are removed, rather than retained, prior to substrate modification.

The silicon can be deposited by using selective epitaxial growth to grow a thin silicon layer in the opening. The subsequent oxidation results in growth primarily in the vertical direction so that the integrity of the sidewall spacers is not adversely affected.

BRIEF DESCRIPTION OF THE DRAWING

For reasons of clarity, the elements of the devices and structures depicted are not drawn to scale and do not necessarily have the same dimensions on each figure. However, identical numerals represent identical elements.

DETAILED DESCRIPTION

The fabrication technique of this invention will be described by reference to a specific embodiment which fabricates a bipolar transistor on a p-type Si substrate. Those skilled in the art will readily appreciate that devices other than the one specifically described may be fabricated and that other embodiments of the growth technique are contemplated using, for example, different materials.

Figure 1:
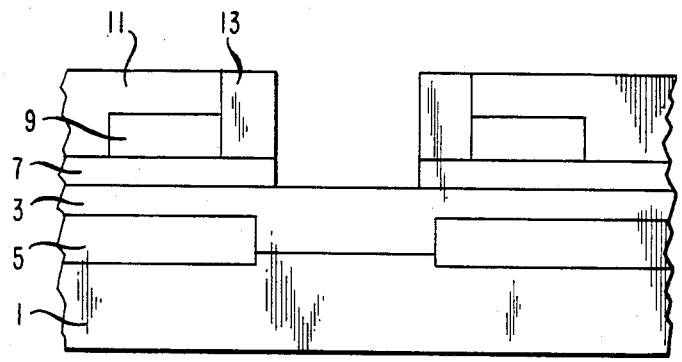
FIGS. 1-6 illustrate steps in the method of this invention thus showing fabrication of devices according to this invention.

The structure depicted in FIG. 1 comprises a silicon substrate 1 having a first conductivity type on which is grown an epitaxial layer 3 having a second conductivity type. There is additionally a buried layer 5 having a second conductivity type between portions of the substrate and the epitaxial layer. The buried layer provides, as will be apparent later to those skilled in the art, a reduction in the RC time constant of the bipolar transistor.

A low temperature oxide layer 7 is deposited on the epitaxial layer 3. The oxide layer will prevent emitter-collector shorts in the bipolar transistor. A silicide layer 9 is deposited and patterned, and a second low temperature oxide layer 11 is deposited. Any conducting material, compatible with processing, may be substituted for the silicide. The silicide and second low temperature oxide layers 9 and 11, respectively, are patterned to form openings which expose portions of the first low temperature oxide layer 7. The openings are filled with a nitride plug. The center of the opening is desirably the mid-point of the distance between the two segments of buried layer 5. An opening in the nitride plug which exposes the surface of the epitaxial layer and leaves sidewall spacers 13 is now formed. FIG. 1 illustrates the structure after the described processing has been completed. Since the structure has bilateral symmetry about the mid-point, numerals have been put on only the left side.

As will be readily appreciated, the structure depicted in FIG. 1 can be fabricated with conventional and well known techniques which need not be described in further detail. Thus, for example, it will be readily appreciated that the techniques used to form the opening in the nitride plug which leaves sidewall spacers are well known to those skilled in the art and need not be described in detail.

Figure 2:
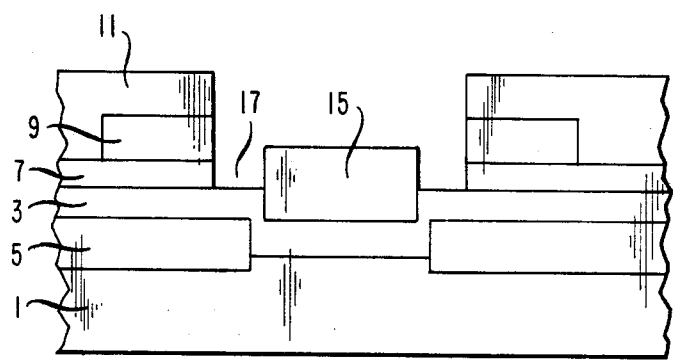

Selective epitaxial deposition is now used to grow silicon on the exposed portions of the silicon substrate in the structure depicted in FIG. 1. The epitaxial silicon is oxidized and the nitride sidewall spacers are removed. Techniques for these steps are well known to those skilled in the art. The thickness of the deposited epitaxial layer and the oxidation process parameters should be selected so that all of the layer is oxidized. During oxidation, the deposited silicon will expand primarily in the vertical direction and not into the sidewall spacers. As can be seen, the oxide also grows a small distance into the substrate. The resulting structure has an oxide region 15 and spaces 17 on opposed sides of the oxide region. This structure is depicted in FIG. 2. An exemplary dimension for the opening, prior to nitride deposition, is 1.0 μm, and the resulting spaces 17 can be as small as perhaps 10 nm. The minimum opening dimension will be determined by the minimum sidewall spacer dimension.

As will be readily appreciated, care must be taken during the oxidation step to preserve the integrity of the sidewall spacers due to their small dimensions. Silicon expands as it is oxidized and the physical integrity of the nitride spacers might be ruined due to horizontal expansion. However, the selective epitaxial growth avoids these problems as expansion of the deposited silicon during oxidation is primarily in the vertical direction. Direct, thermal oxidation of the substrate is not preferred.

Figure 3:
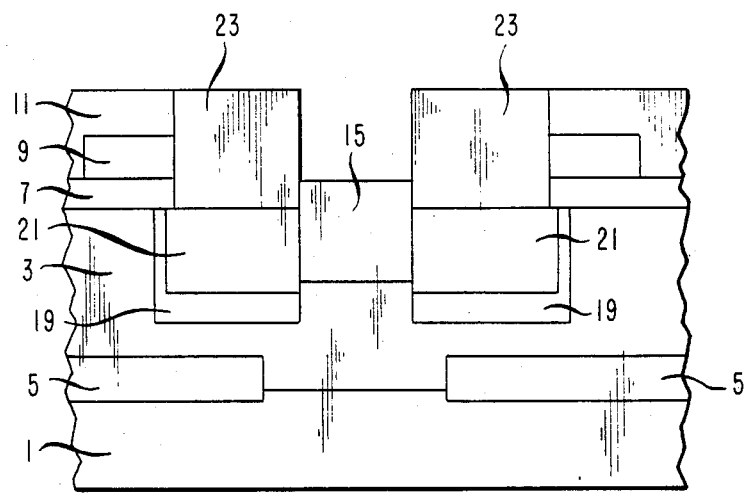

Successive ion implantations may now be used to form the base region 19 and the emitter region 21. The base and emitter regions have first and second conductivity types, respectively. Polysilicon is now deposited to form polysilicon regions 23. The polysilicon is desirably deposited by selective low pressure chemical vapor deposition to eliminate the need for a patterning step. The structure is depicted in FIG. 3.

Figure 4:
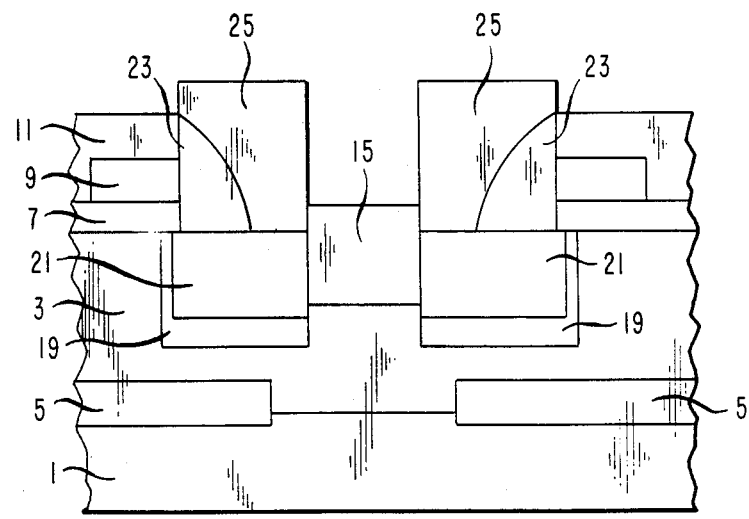

Polysilicon regions 23 are now partially oxidized to form oxide caps 25 as depicted in FIG. 4.

Figure 5:
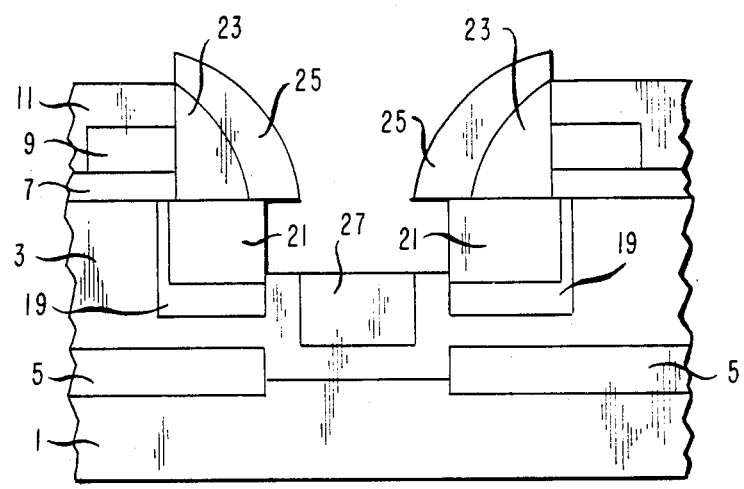

Etching techniques, such as reactive ion etching, are now used to remove the oxide layer 15 and thereby expose the underlying portion of the surface of the epitaxial layer 3 having a second conductivity type. Some rounding of oxide cap 25 occurs as shown. An ion implantation step is now used to form the passive base region 27 and the resulting structure is depicted in FIG. 5.

Figure 6:
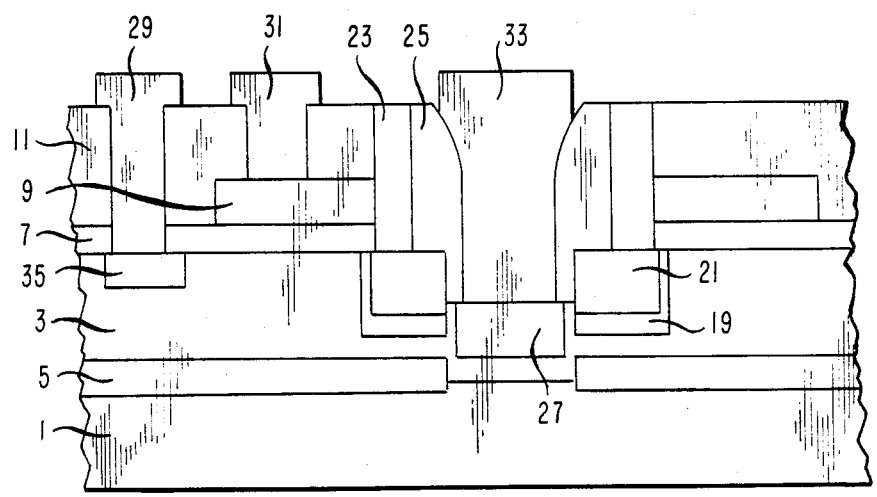

Well known techniques are used to form openings for the contacts. There are collector, emitter and base contacts 29, 31, and 33, respectively. An implantation is used to form region 35 for better contact to the collector region. The finished device is shown in FIG. 6.

The ultimate resolution of the described lithographic technique is determined by the thickness of the nitride sidewall spacer remaining after etching to form the opening depicted in FIG. 1. The process is reproducible with respect to dimensions because the etch occurs in the rather wide opening, i.e., the vertical surfaces are the primary surfaces etched, rather than the smaller horizontal surfaces. Additionally, the base contact is close, perhaps as close as 70 nm, to the base, and as a result has only a minimal series resistance.

It will be readily appreciated that the emitter contact is made through a low sheet resistance buried silicide layer and that the collector contact is made directly to the epitaxial layer. Both of these contacts minimize resistance.

It will be readily appreciated by those skilled in the art that although an n-p-n transistor has been depicted that p-n-p transistors will be easily fabricated by using the opposite conductivity type in each step. It will also be appreciated that complementary devices, that is, both n-p-n and p-n-p, may be fabricated in the same substrate by using alternating doping and masking processes. Other materials, such as silicides, i.e., self aligned silicides, may be used. Use of such materials in the emitter is contemplated. The base implant can be omitted and a JFET fabricated.

Other devices are contemplated. For example, etching down to the n-type epitaxial layer to form a Shottky diode permits fabrication of a Shottky clamped bipolar transistor for high switching speed applications. Also, a long N-channel JFET can be built in the same process and is useful for BiFet applications. A short N-channel JFET pair can be fabricated with the channel length determined by a vertical P diffusion or implantation. Additionally, a high speed lateral transistor can be made with the narrow base width being determined by nitride thickness rather than conventional etching.

What is claimed is:

1. A method of fabricating a semiconductor device comprising the steps of:
   patterning a first dielectric layer on a semiconductor substrate to form openings which expose portions of a surface of the semiconductor substrate;
   depositing a silicon nitride layer so as to cover the patterned dielectric layer;
   etching the silicon nitride layer to form sidewall spacers in said openings which leave portions of said semiconductor surface exposed;
   growing a layer of silicon on said portions of said surface not covered by said sidewall spacers utilizing a selective epitaxial growth process;
   oxidizing said epitaxially grown silicon layer;
   removing said sidewall spacers to expose portions of said semiconductor substrate previously underneath said sidewall spacers; and
   doping said exposed portions of said semiconductor substrate to form active device regions.

2. A method as recited in claim 1 in which said doping is by diffusion or ion implantation.

3. A method as recited in claim 2 in which said modifying comprises ion implantation.

4. A method as recited in claim 1 in which said doping forms two active device regions of opposite conductivity type, said two active device regions forming emitter and extrinsic base regions.

5. A method as recited in claim 4 in which said substrate forms a collector region.

6. A method as recited in claim 5 further comprising the step of forming electrical contacts to said emitter, base, and collector regions.

7. A method as recited in claim 1 comprising the further steps of removing the oxidized silicon to expose portions of underlying materials and doping said exposed portions to form active device regions, said active device regions forming intrinsic base regions.

* * * * *